United States Patent
Furuta

Patent Number: 6,034,748
Date of Patent: Mar. 7, 2000

[54] THIN FILM TRANSISTOR, MANUFACTURING METHOD THEREFOR AND LIQUID CRYSTAL DISPLAY UNIT USING THE SAME

[75] Inventor: Mamoru Furuta, Kanazawa, Japan

[73] Assignee: Matsushita Electric Industrial Co., Ltd., Japan

[21] Appl. No.: 09/053,497

[22] Filed: Apr. 2, 1998

[30] Foreign Application Priority Data

Apr. 8, 1997 [JP] Japan ........................... 9-088563

[51] Int. Cl.[7] ........................... G02F 1/136; H01L 29/76; H01L 31/0312
[52] U.S. Cl. ........................ 349/43; 257/66; 257/72
[58] Field of Search ........................ 349/43; 257/336, 257/344, 66, 72

[56] References Cited

U.S. PATENT DOCUMENTS

| | | | |
|---|---|---|---|
| 5,693,959 | 12/1997 | Inoue et al. | 349/43 |
| 5,834,797 | 11/1998 | Yamanaka | 349/43 |

FOREIGN PATENT DOCUMENTS

| | | |
|---|---|---|
| 0723286A2 | 7/1996 | European Pat. Off. . |
| 0738012A2 | 10/1996 | European Pat. Off. . |
| 0795904A2 | 9/1997 | European Pat. Off. . |
| 4-344618 | 12/1992 | Japan . |

OTHER PUBLICATIONS

International Display Research Conference '93, by Y. Hayashi et al., pp. 465–468.

*Primary Examiner*—William L. Sikes
*Assistant Examiner*—Joanne Kim
*Attorney, Agent, or Firm*—Parkhurst & Wendell, L.L.P.

[57] ABSTRACT

With a conventional thin film transistor comprising a plurality of series-connected thin film transistors each having a plurality of LDD structures, leakage current can be decreased to a large effect but the area of an element can hardly be reduced. By connecting gate electrodes (15) of a plurality of thin film transistors only with an implanted region (13b) which is formed by implanting an impurity at a low concentration into a semiconductor thin film employed as an active layer, both reduction in element size and decrease in leakage current can be realized.

3 Claims, 5 Drawing Sheets

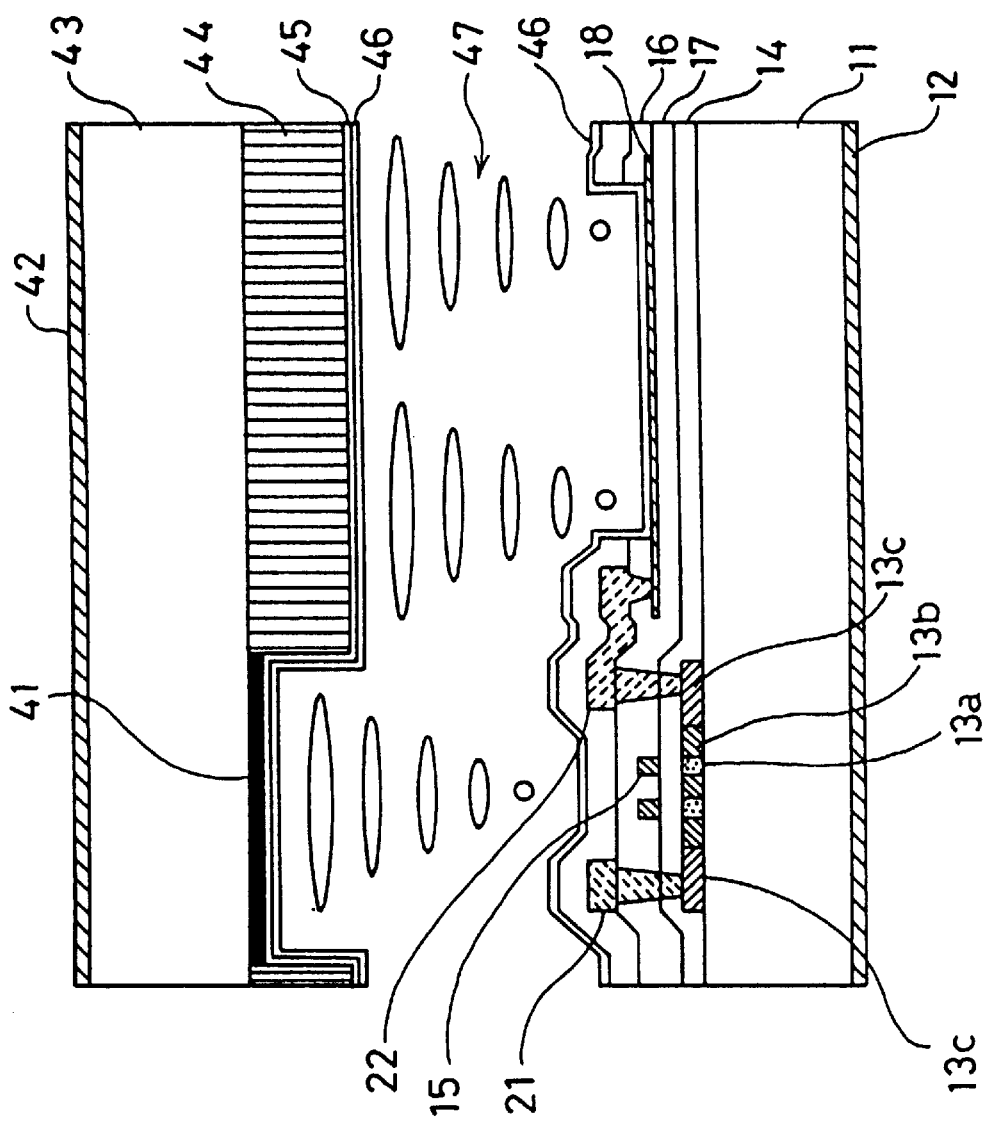

THIN FILM TRANSISTOR, MANUFACTURING METHOD THEREFOR AND LIQUID CRYSTAL DISPLAY UNIT USING THE SAME

FIELD OF THE INVENTION

The present invention relates to an Lightly-Doped-Drain structure (hereinafter, abbreviated to LDD structure) for the purpose of reducing leakage current in a polycrystalline silicon thin-film transistor (hereinafter, abbreviated to TFT) and a manufacturing method therefor, whose technique is applicable to a liquid crystal display unit or the like.

BACKGROUND OF THE INVENTION

Conventionally, to decrease the leakage current of a polycrystalline silicon TFT, the LDD structure is proposed. Besides, to further reduce the leakage current, a structure in which LDD structures are connected in series is also proposed. A description on this technique is found, for example, in International Display Research Conference '93, p. 465.

FIGS. 5a to 5d show a method for manufacturing a conventional TFT in which LDD structures are connected in series.

As shown in FIG. 5a, an amorphous silicon thin-film is formed on a light-transmittal glass substrate 11 (highly heat-resistant glass substrate) by the plasma chemical vapor deposition (PCVD) method and is subjected to thermal treatment at 600° C. to form a polycrystalline silicon thin-film 13 serving as an active layer.

This polycrystalline silicon thin-film is machined into the shape of isles and a silicon oxide thin-film serving as a gate insulating film 14a is formed thereon in a thickness of 85 nm. On this silicon oxide thin-film, two gate electrodes 15 are formed. After the formation of the gate electrodes, a first impurity is implanted with the gate electrodes 15 employed as masks by the ion plantation method to form an implanted region (n– region) 13b of the lower-concentration impurity.

For the first impurity implantation, phosphorus (P) ions are implanted under an acceleration voltage of 80 kV in a dose amount of $1 \times 10^{13}$ /cm$^2$. At this time, the polycrystalline silicon thin-film below the gate electrodes 15 serves as the channel region 13a of the TFT.

After the implantation of the first impurity, an implantation mask using a photoresist is formed on the LDD region of the TFT with the aid of a photoresist 25 as shown in FIG. 5b and then a second impurity is implanted to form an implanted region (n+ region) 13c of the higher-concentration impurity serving as the source and drain regions of the TFT.

At this time, as shown in FIG. 5b, an opening is provided also on the polycrystalline silicon region between the gate electrodes and the resist mask is formed in such a shape that the thin polycrystalline silicon films between the electrodes of each gates are connected via both of the implanted region 13b of the lower-concentration impurity and the implanted region 13c of the higher-concentration impurity.

For the second impurity implantation, phosphorus (P) ions are implanted under an acceleration voltage of 80 kV in a dose amount of $1 \times 10^{15}$ /cm$^2$. After the implantation of the second impurity, the photoresist mask is removed and the activation treatment of the implanted impurity is given at 900° C. for 2 hours.

After the activation treatment, an inter-layer insulating film 16 is formed as shown in FIG. 5c. Finally, as shown in FIG. 5d, source and drain electrodes 21 and 22 are formed after boring the respective contact holes, and a TFT is completed.

The TFT explained in the conventional example has the implanted region 13c of the higher-concentration impurity equal in concentration to the source and drain regions between the electrodes of each gate. For this reason, an opening needs to be formed in the doping mask at the forming time of the source and drain regions of the TFTs connected in series, i.e., photoresist 25, as shown in FIG. 5b.

Conventionally, it is considered that, by the provision of an opening between the electrodes of each gates, i.e., the implanted region 13c of the higher-concentration impurity, the electric field intensity between the source and drain electrodes is alleviated and the leakage current of the TFT is reduced.

The shorter the length of this opening is, the easier an element can be made minute; but the shortening is restricted by the pattern precision of an exposer, i.e., the minimum exposure line width.

Besides, the length of the implanted region 13b of the lower-concentration impurity between the electrodes of each gates is restricted by the value given by adding the mask focusing accuracy of the exposer to the design size.

Thus, letting Wa ($\mu$m), Ld ($\mu$m) and La ($\mu$m) be the minimum exposure width of the exposer in a TFT having a series-connected construction of TFTs having the LDD structure, the design length of the lower-concentration impurity implanted region, and the focusing accuracy of the exposer, respectively, it is difficult to make the minimum size of each TFT not greater than Wa+2Ld+La.

Generally, with an exposer for large-sized substrates used for the manufacturing of a liquid crystal display unit, the above-mentioned values are typically on the order of Wa=5 $\mu$m and La=1 $\mu$m, and when Ld=2 $\mu$m, it is difficult to make the distance between the gate electrode not greater than 10 $\mu$m.

A case of employing such an element as the switching element of a liquid crystal display unit causes a reduction in the opening ratio of the liquid crystal display unit, thus posing problems such as a lowering in luminosity or an increase in consumed power.

In a series-connected construction of TFTs having an LDD structure, it is an object of the present invention to provide a TFT capable of making the element minute while reducing the leakage current of the TFT, a manufacturing method therefor, and a liquid crystal display unit.

DISCLOSURE OF THE INVENTION

To solve this problem, the present invention provides a TFT having a polycrystalline silicon thin film employed as an active layer and a plurality of gate electrodes provided in one TFT, wherein low-concentration impurity implanted regions are provided between a channel region and source and drain regions of the TFT, and polycrystalline silicon thin films between each gate electrode are connected only by low-concentration impurity implanted regions.

Besides, the present invention provides a TFT having a polycrystalline silicon thin film employed as the active layer, a gate insulating film provided on the polycrystalline silicon thin film, and a plurality of gate electrodes provided on the gate insulating film, wherein in forming an LDD structure with low-concentration impurity implanted regions provided between the channel region and the source and drain regions, the first impurity is implanted with the gate electrode employed as a mask, thereafter an implantation mask is formed on a region serving as the LDD region including the polycrystalline silicon region between gate electrodes, and thus a second impurity is implanted.

Furthermore, the present invention provides a TFT having a polycrystalline silicon thin film employed as the active layer, a gate insulating film provided on the polycrystalline silicon thin film, and a plurality of gate electrodes provided on the gate insulating film, wherein in forming an LDD structure with implanted regions of a low-concentration impurity between the channel region and the source and drain regions, a single-time implantation of an impurity is carried out with the gate electrodes employed as mask after stacking a foreign insulating film on the polycrystalline silicon thin film, the upper layer insulating film of the above gate insulating film is removed at least on the source and drain regions, and the insulating film is machined into such a shape as to cover the low-concentration impurity region and the polycrystalline silicon between each gate electrode.

The present invention provides an active matrix array for a liquid crystal display unit with a polycrystalline silicon thin film employed as the active layer and a drive circuit integrated in the same substrate, comprising a plurality of gate electrodes at least for a TFT for driving pixel electrodes, and an LDD structure with implanted regions of a low-concentration impurity between the channel region and the source and drain regions of the above TFT, wherein the polycrystalline silicon thin film between each gate electrode is connected by the implanted region of a low-concentration impurity.

In one embodiment, the TFT of the present invention relates to a TFT having a polycrystalline silicon thin-film employed as the active layer, and a plurality of gate electrodes provided in one transistor, characterized in that implanted polycrystalline sylicon regions between a channel region and source and drain regions of the TFT are implanted with an impurity at a lower concentration than the above source and drain regions, and the polycrystalline silicon thin-films between each gate electrodes are formed only of the above implanted polycrystalline silicon thin-films implanted with an impurity at a lower concentration.

As a result, the size between each gate electrode can be defined only by the minimum line width of an exposer, and both reduction in element size and decrease in leakage current can be realized.

Moreover, the TFT according to the present invention is featured by the sheet resistance of an implanted polycrystalline silicon thin-film implanted with an impurity at a low concentration being preferably 5 k$\Omega$–150 k$\Omega$.

Furthermore, the TFT according to the present invention is featured by the total length of all the polycrystalline silicon thin-films implanted with a low-concentration impurity included between the source and drain regions ranging from 6 $\mu$m to 12 $\mu$m in the longitudinal direction of the channel of the TFT.

Besides, in manufacturing a TFT having a polycrystalline silicon thin-film employed as the active layer, a gate insulating film provided on the above polycrystalline silicon thin film, a plurality of gate electrodes provided on the gate insulating film, and an LDD structure having implanted regions of a low-concentration impurity between the channel region and the source and drain regions, a method for manufacturing the TFT according to the present invention is featured by comprising the steps of: after implanting the first impurity, forming an implantation mask on regions serving as the LDD region including the region above the polycrystalline silicon region between the gate electrodes; and by implanting a second impurity, forming an implanted region of a high-concentration impurity serving as the source and drain regions of the TFT.

Besides, in manufacturing a TFT having a polycrystalline silicon thin film employed as the active layer, a gate insulating film provided on the above thin film of polycrystalline silicon, a plurality of gate electrodes provided on the gate insulating film, and an LDD structure having implanted regions of a low-concentration impurity between the channel region and the source and drain regions, the method for manufacturing the TFT according to the present invention is featured by comprising the steps of: stacking a foreign gate insulating film on the polycrystalline silicon thin-film; removing the upper layer insulating film of the above gate insulating film at least on the source and drain regions; machining said insulating film in such a shape as to cover the low-concentration impurity region and the polycrystalline silicon film between each gate electrode; thereafter forming the source and drain regions of the TFT and the implanted region of a low-concentration impurity by a single-time implantation of the impurity; and after implanting the impurity, removing an upper layer gate insulating film covering the low-concentration impurity region and the polycrystalline silicon film between the electrodes of each gate. And the method is further featured by forming the gate insulating film of a two-layer gate insulating film composed of a thin silicon oxide film on the polycrystalline silicon thin film and a silicon nitride or tantalum oxide film.

A liquid crystal display unit using an active matrix array according to the present invention is featured in that the active matrix array having a polycrystalline silicon thin film employed as the active layer and a drive circuit integrated in one same substrate comprises: a plurality of gate electrodes at least for a TFT for driving the pixel electrodes; an LDD structure with implanted regions of a low-concentration impurity between the channel region and the source and drain regions of the above TFT; and the polycrystalline silicon thin film between the electrodes of each gate which is formed only of an implanted region of a low-concentration impurity.

BRIEF DESCRIPTION OF THE DRAWINGS

FIG. 4 is a sectional view of the liquid crystal display unit using the active matrix array according to Embodiment 3 of the present invention.

Hereinafter, embodiments of the present invention will be described using the drawings.

EMBODIMENT 1

FIGS. 1a to 1d show the manufacturing steps of a TFT with the LDD structure of Embodiment 1 of the present invention.

Figure 1A:
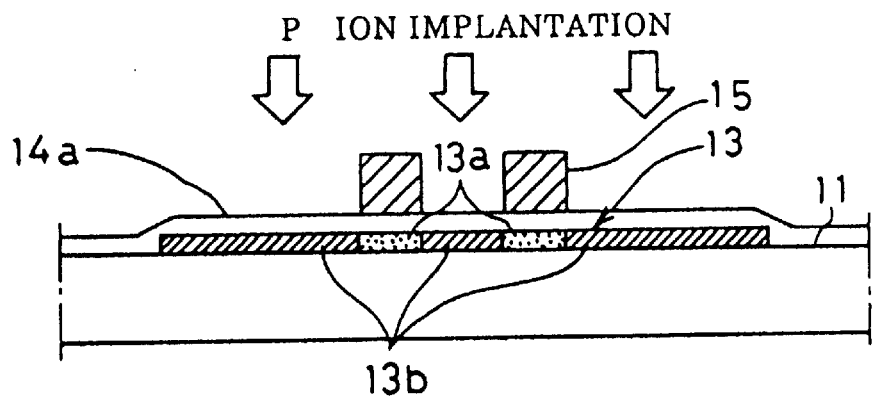
FIGS. 1a to 1d are sectional views of TFTs according to Embodiment 1 of the present invention.

First, as shown in FIG. 1a, an amorphous silicon thin film is formed on a glass substrate 11 surface-coated with silicon oxide in a thickness of 50 nm by the plasma CVD method.

After being subjected to heat treatment in nitrogen under 450° C. for 90 minutes to reduce the hydrogen concentration in the film, the amorphous silicon thin film is crystallized by the excimer laser irradiation to form a polycrystalline silicon thin film 13 serving as the active layer.

This polycrystalline silicon thin film 13 is machined into the shape of a TFT, and a silicon oxide film is formed thereon in a thickness of 85 nm to serve as a gate insulating film 14a.

On this silicon oxide film, two gate electrodes 15 connected electrically are formed. Each inter-electrode distance is formed to be a minimum line width of 5 μm of the exposer. The gate electrode 15 comprises an 80 nm thick titanium (Ti) so formed as to come into contact with the silicon oxide film, and a 100 nm aluminum (Al) alloy containing 7.4% of zirconium (Zr) on the titanium film in a total thickness of 180 nm.

After the formation of the gate electrode, a first impurity implantation is carried out for implanting phosphorus (P) at an acceleration voltage of 80 kV in an implantation dose amount of $1 \times 10^{13}/cm^2$ with the gate electrode 15 employed as a mask by the ion doping method so as to form an implanted region (n− region) 13b of the lower-concentration impurity.

With the ion doping method, a gas mixture of hydrogen gas and $PH_3$ of 5% concentration is subjected to plasma decomposition by high-frequency discharge, and the generated ions are implanted into a TFT without a mass separation process. At this time, the polycrystalline silicon thin film below the gate electrode 15 serves as the channel region 13a of the TFT.

Figure 1B:
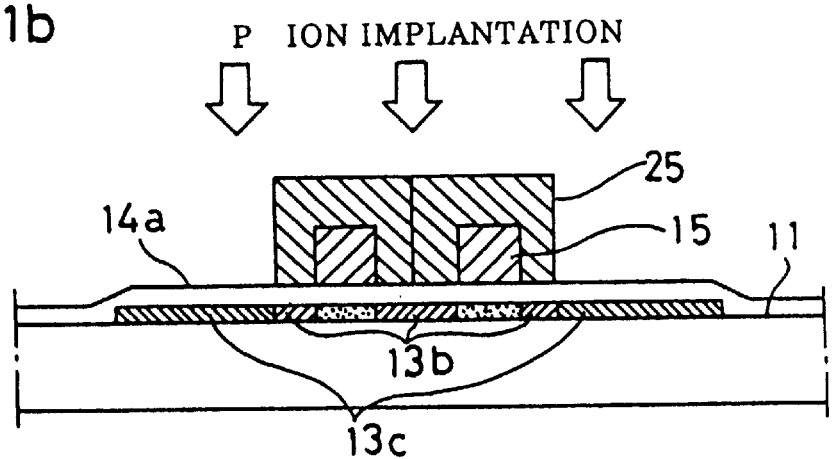

After the implantation of the first impurity, an implantation mask is formed on the LDD region of the TFT by using a photoresist 25 as described in FIG. 1b and thereafter a second impurity is implanted to form an implanted region (n+ region) 13c of the higher-concentration impurity serving as the source and drain regions of the TFT. As the implantation of the second impurity, phosphorus (P) ions are implanted at an acceleration voltage of 80 kV in a dose amount of $1 \times 10^{15}/cm^2$.

At this time, as shown in FIG. 1b, the resist mask is formed to completely cover the top of the polycrystalline silicon region between each gate electrode. Thereby, the polycrystalline silicon thin film between each gate electrode is formed in such a shape as to be connected only through the implanted region 13b of the lower-concentration impurity.

Figure 1C:
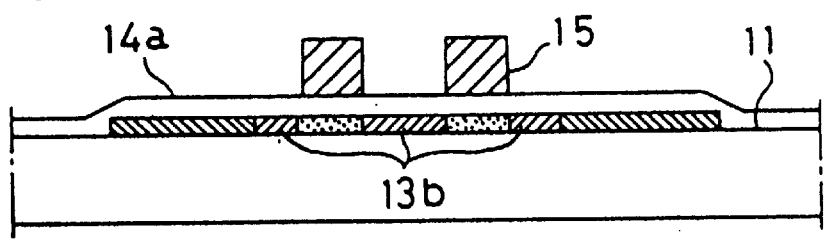
Figure 1D:
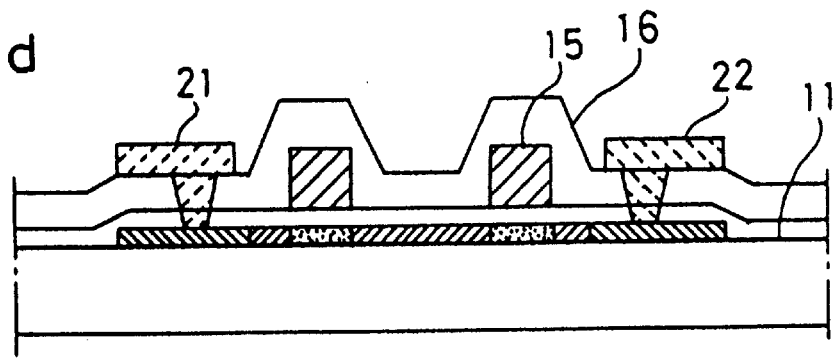

After the implantation of the second impurity, the photoresist mask is removed as shown in FIG. 1c to perform an activation treatment of the implanted impurity. After the activation treatment, an inter-layer insulating film 16 is formed as shown in FIG. 1d. Finally, after boring a contact hole, the source and drain electrodes 21 and 22 are formed, thus completing a TFT.

EMBODIMENT 2

FIGS. 2a to 2d show the manufacturing steps of a TFT having the LDD structure of Embodiment 2 of the present invention.

Figure 2A:
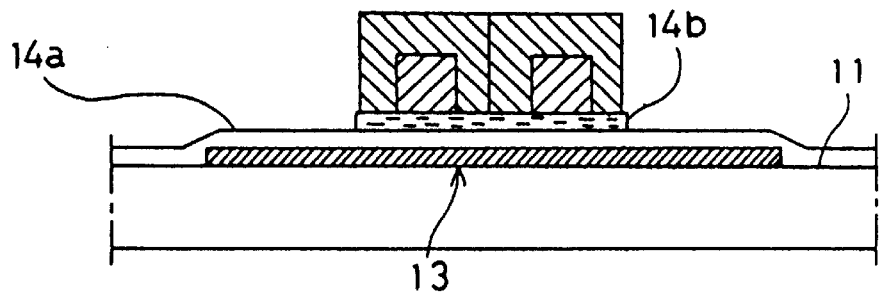
FIGS. 2a to 2d are sectional views of TFTs according to Embodiment 2 of the present invention.

First, as shown in FIG. 2a, an amorphous silicon thin film is formed on a glass substrate 11 surface-coated with silicon oxide in a thickness of 50 nm by the plasma CVD method. After being subjected to heat treatment in nitrogen under 450° C. for 90 minutes to reduce the hydrogen concentration in the film, the amorphous silicon film is crystallized by the excimer laser annealing to form a thin polycrystalline silicon film 13 serving as the active layer.

This polycrystalline silicon thin film 13 is machined into the shape of a TFT to form thereon a silicon oxide film serving as the gate insulating film 14a in a thickness of 85 nm. On this silicon oxide film, a tantalum oxide film serving as a second gate insulating film 14b is formed in a thickness of 50 nm. Then, two gate electrodes 15 are formed on the tantalum oxide film. The gate electrode 15 comprises an 80 nm thick titanium (Ti) so formed as to come into contact with the tantalum oxide film and a 100 nm aluminum (Al) alloy containing 7.4% of zirconium (Zr) on the titanium film in a total thickness of 180 nm.

After the formation of the dual gate electrode, only the region above the LDD regions and between both electrodes of the TFT is coated with tantalum oxide, and the tantalum oxide films above the source and drain regions are selectively removed.

Figure 2B:
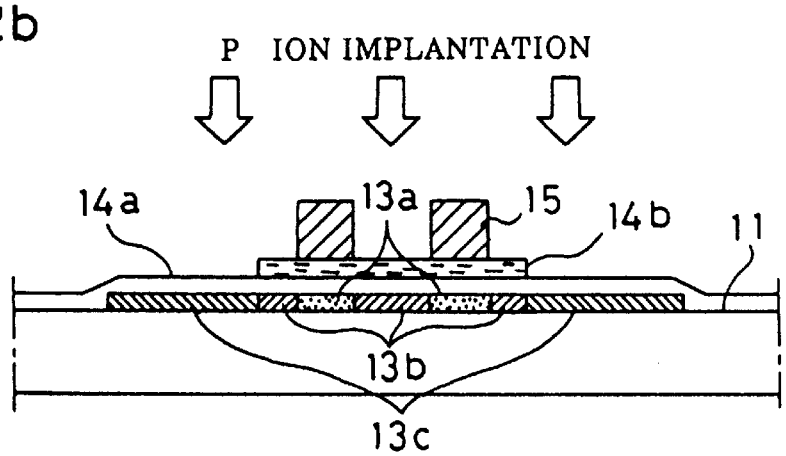

After machining the thin tantalum oxide films into the above shape, phosphorus (P) is implanted at an acceleration voltage of 80 kV in an implantation dose amount of $1 \times 10^{15}/cm^2$ by the ion doping method as shown in FIG. 2b. With the ion doping method, a gas mixture of hydrogen gas and $PH_3$ of 5% concentration is subjected to plasma decomposition by high-frequency discharge and the generated ions are implanted into a TFT without a mass separation process.

Thus, phosphorus ions are implanted through the monolayer silicon oxide film in the source and drain regions of the TFT, and through the laminate film of tantalum oxide and silicon oxide in the LDD regions and the region between each gate electrodes. In the region implanted through the laminate film of tantalum oxide and silicon oxide, i.e., the LDD regions and the region between each gate electrode, the implantation amount decreases as compared with the regions implanted through the monolayer silicon oxide film, i.e., the source and drain regions of the TFT. By a single-time impurity implantation, both of the source and drain regions corresponding to the implanted region 13c of the higher-concentration impurity and the LDD regions corresponding to the implanted region 13b of the lower-concentration impurity are formed simultaneously.

Furthermore, at this time, each gate electrode of the TFT is connected by the implanted region 13b of the low-concentration impurity comprising a polycrystalline silicon thin film implanted with the low-concentration impurity of the same concentration as with the LDD regions.

Incidentally, the polycrystalline silicon thin films below the gate electrodes 15 serve as the channel region 13a of the TFT.

Figure 2C:
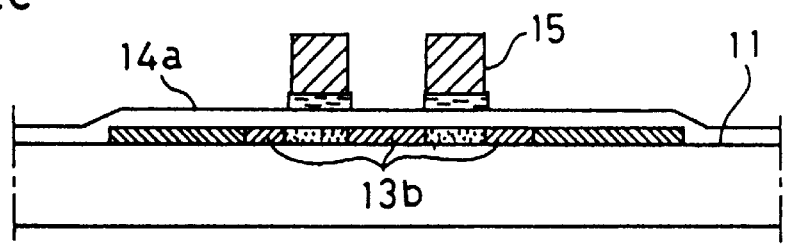

After the implantation of impurity into the TFT, the tantalum oxide thin film is removed on the LDD regions as shown in FIG. 2c.

Figure 2D:
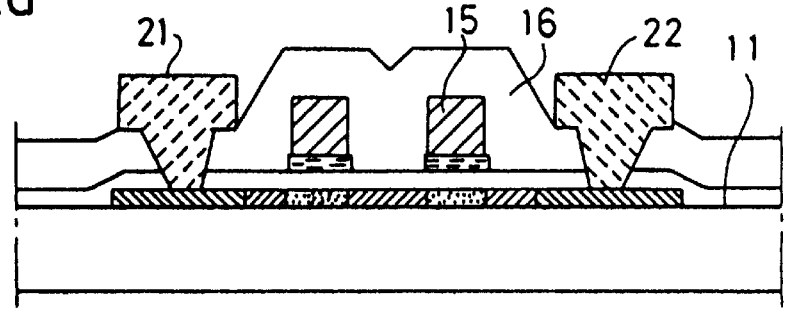

Thereafter, the inter-layer insulating film 16 made of silicon oxide is formed as shown in FIG. 2d. Silicon oxide is formed at 430° C. by the normal pressure CVD method, and the impurity implanted simultaneously in this process can be activated. Finally, after boring a contact hole, the source and drain electrodes 21 and 22 are formed, thus completing a TFT.

EMBODIMENT 3

FIGS. 3a to 3d show the manufacturing steps of an active matrix array for a liquid crystal display unit according to Embodiment 3 of the present invention.

Figure 3A:
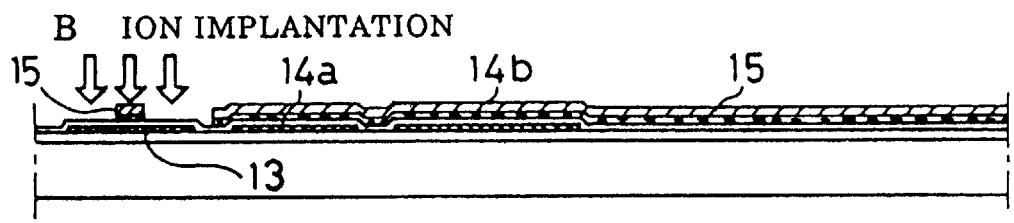
FIGS. 3a to 3d are sectional views of active matrix arrays for a liquid crystal display unit according to Embodiment 3 of the present invention.

First, as shown in FIG. 3a, an amorphous silicon thin film is formed on a glass substrate 11 surface-coated with silicon oxide in a thickness of 50 nm by the plasma CVD method. After being subjected to heat treatment in nitrogen under 450° C. for 90 minutes to reduce the hydrogen concentration in the film, the amorphous silicon film is crystallized by the excimer laser annealing to form a polycrystalline silicon thin film 13.

The polycrystalline silicon thin film 13 is machined into the shape of a TFT to form a silicon oxide film serving as the gate insulating film 14a in a thickness of 85 nm. On this silicon oxide film, a tantalum oxide film serving as a second gate insulating film 14b is formed in a thickness of 50 nm.

Then, gate electrodes 15 are formed on a p-channel TFT. The gate electrode 15 comprises an 80 nm thick titanium (Ti) film so formed as to come into contact with the tantalum oxide film and a 150 nm aluminum (Al) alloy film containing 7.4% of zirconium (Zr) on the titanium film in a total thickness of 230 nm. At this time, a gate electrode material is coated on the n-channel TFT.

Thereafter, boron (B) is implanted into the source and drain regions of the p-channel TFT. Boron implantation proceeds at an acceleration voltage of 60 kV in a dose amount of $5 \times 10^5/cm^2$ by using the ion doping method.

Figure 3B:
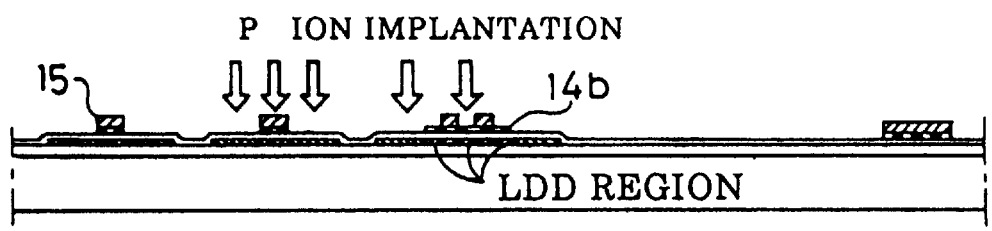

After the implantation of boron ions, a gate electrode 15 is formed on the n-channel TFT as shown in FIG. 3b. The gate electrode of a pixel TFT is of a dual gate construction, and the tantalum oxide films above the source and drain regions are selectively removed with the tantalum oxide films above the LDD region and between each gate electrode of the pixel TFT being left as they are. After machining the thin tantalum oxide films into the above shape, phosphorus (P) is implanted at an acceleration voltage of 80 kV in an implantation dose amount of $1 \times 10^{15}/cm^2$ by the ion doping method.

At this time, each gate electrode of a pixel TFT is connected by the polycrystalline silicon thin film into which a low-concentration impurity identical in concentration to that in the LDD regions is implanted. After the impurity implantation into the TFT, the thin tantalum oxide films above the LDD regions and between each gate electrodes are removed using the gate electrodes as a mask. This tantalum oxide removal process enables the OFF current of the TFT to be greatly reduced.

Figure 3C:
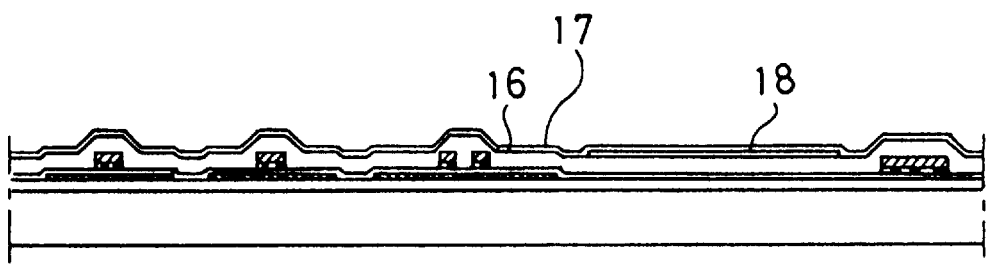

Next, as shown in FIG. 3c, a first inter-layer insulating film 16 comprising silicon oxide is formed. The silicon oxide is formed at 430° C. by using the normal pressure CVD method, and the impurity implanted simultaneously in this process can be activated. On the first inter-layer insulating layer 16, a pixel electrode 18 comprising an ITO (Indium-Tin-Oxide) film is formed, and a second inter-layer insulating layer 17 comprising silicon oxide is formed.

Figure 3D:
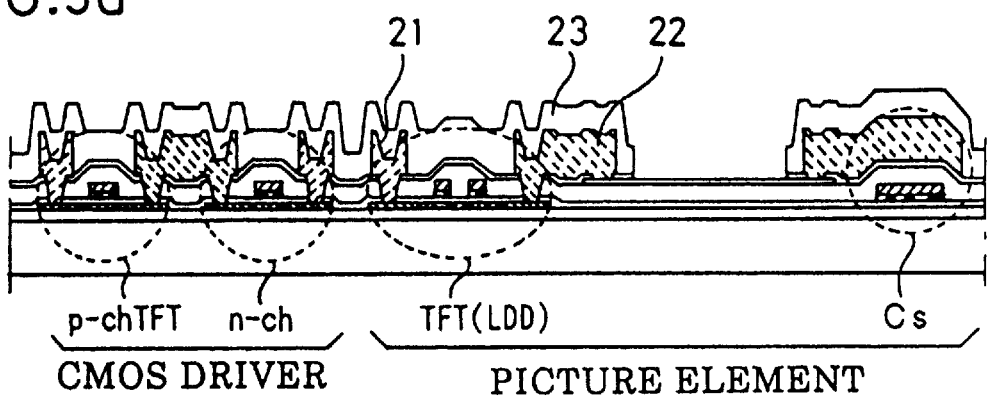
Figure 5A:
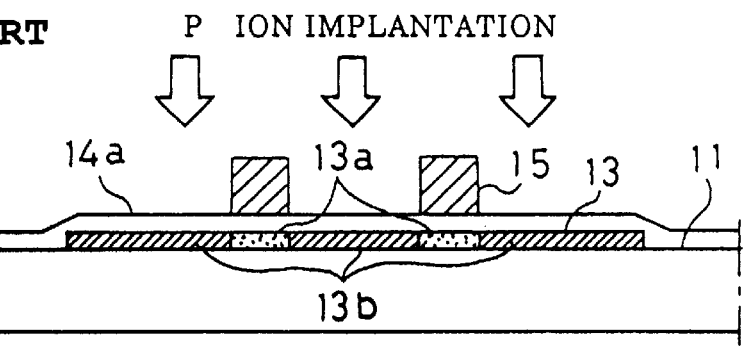
FIGS. 5a to 5d are sectional views of conventional TFTs.
Figure 5B:
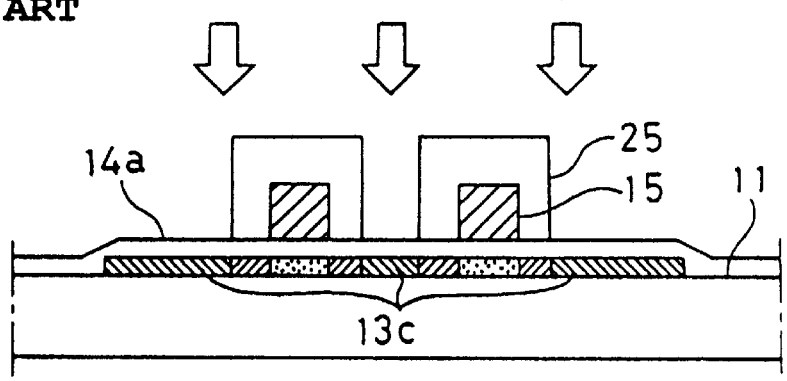
Figure 5C:
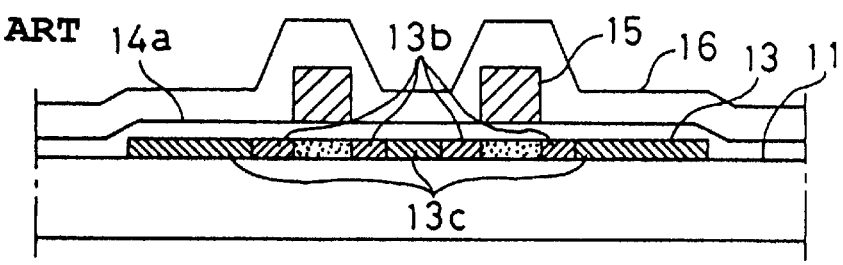
Figure 5D:
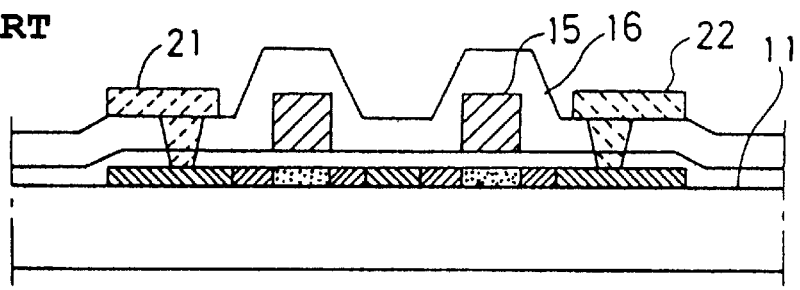

After boring a contact hole, the source and drain electrodes 21 and 22 are formed as shown in FIG. 3d. Further, after a silicon nitride film serving as the protective film 23 is formed by the plasma CVD and subjected to a 350° C. annealing in the atmosphere of hydrogen, the silicon nitride and silicon oxide laminate films above the pixel electrode 18 are selectively removed to complete an active matrix array.

FIG. 4 is one example of a sectional constitution view of a liquid crystal display unit fabricated by using an active matrix array shown in FIGS. 3a to 3d, which represents the pixel section in an enlarged view. Between the active matrix array formed on the glass substrate 11 and the opposed substrate 43, liquid crystals 47 are retained via oriented films 46, and a pixel electrode 18 is driven by using a TFT as the switching element to charge the liquid crystals and thus the image display is carried out.

In contrast to the case of employing a conventional double LDD TFT as the pixel, this liquid crystal display unit is capable of making the element minute and improving the opening ratio of the liquid crystal display unit. Here, numerals 41, 42, 44 and 45 denote a black matrix, a deflecting plate, a color filter and a transparent conductive layer, respectively.

Incidentally, although a case of a pixel driving TFT having the LDD structure has been described in this embodiment, the LDD structure may be employed also at least in part of an n-channel TFT in the drive circuit section. The LDD structure allows effective improvement especially in reliability of the TFT.

Thus, with the TFT having the LDD structure according to the present invention, both the decrease in leakage current of the TFT and the reduction in element size can be implemented by connecting the electrodes of each gates only by a low-concentration impurity region preferably having a sheet resistance of 5 kΩ–150 kΩ as described above. The size of distance between each gate electrodes in the TFT is determined only by the minimum line width of an exposer and can be made to be 5 μm, thereby realizing the reduction of the element size to be 50% that of a conventional example, that is 10 μm.

With the liquid crystal display unit using the active matrix array according to the present invention, the element size of the TFT driving a pixel electrode can be reduced, as well as the effect of increasing luminosity accompanying the improvement in resolving power and opening ratio and the effect of reducing consumed power can be achieved.

I claim:

1. A thin film transistor having a polycrystalline silicon thin film employed as an active layer and a plurality of gate electrodes provided in one transistor, wherein polycrystalline silicon regions are located between a channel region and source and drain regions of the thin film transistor, said polycrystalline silicon regions being implanted with an impurity at a lower concentration than that in said source and drain regions, wherein the polycrystalline silicon thin film between each gate electrode comprises said polycrystalline silicon thin film implanted with a low-concentration impurity; and wherein a total length of all polycrystalline silicon thin films implanted with the low-concentration impurity which are included between the source and drain regions of the thin film transistor ranges from 6 μm to 12 μm in the longitudinal direction of the channel of the thin film transistor.

2. A thin film transistor as set forth in claim 1, wherein sheet resistance of said polycrystalline silicon thin film implanted with the low-concentration impurity is between 5 kΩ–150 kΩ.

3. A liquid crystal display unit using an active matrix array having a polycrystalline silicon thin film employed as an active layer and a drive circuit integrated in a same substrate, said active matrix array comprising:

a plurality of gate electrodes provided at least a thin film transistor for driving pixel electrodes;

an LDD structure having implanted regions of a low-concentration impurity between a channel region and source and drain regions of said thin film transistor; and a polycrystalline silicon thin film between each gate electrode comprising the implanted region of the low-concentration impurity, wherein a total length of all polycrystalline silicon thin films implanted with the low-concentration impurity which are included between the source and drain regions of the thin film transistor ranges from 6 μm to 12 μm in the longitudinal direction of the channel of the thin film transistor.

* * * * *